United States Patent
Sugita

(10) Patent No.: US 7,514,316 B2
(45) Date of Patent: Apr. 7, 2009

(54) SEMICONDUCTOR DEVICE AND METHOD OF MANUFACTURING THE SAME

(75) Inventor: Yoshihiro Sugita, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 343 days.

(21) Appl. No.: 11/133,271

(22) Filed: May 20, 2005

(65) Prior Publication Data
US 2005/0208719 A1  Sep. 22, 2005

Related U.S. Application Data

(63) Continuation of application No. PCT/JP03/03510, filed on Mar. 24, 2003.

(51) Int. Cl.
*H01L 21/8242* (2006.01)
(52) U.S. Cl. .............................. 438/240; 257/E21.625
(58) Field of Classification Search .............. 438/585, 438/211, 216, 240, 608, 609; 257/E21.625
See application file for complete search history.

(56) References Cited

U.S. PATENT DOCUMENTS

| | | | | |
|---|---|---|---|---|
| 4,930,044 | A * | 5/1990 | Eda et al. | 361/313 |
| 6,593,748 | B1 * | 7/2003 | Halliyal et al. | 324/455 |
| 7,071,038 | B2 * | 7/2006 | Triyoso et al. | 438/151 |
| 7,101,813 | B2 * | 9/2006 | Ahn et al. | 438/778 |
| 2001/0023120 | A1 | 9/2001 | Tsunashima et al. | |

FOREIGN PATENT DOCUMENTS

| | | |
|---|---|---|
| EP | 1 124 262 A2 | 8/2001 |
| JP | 63-182847 | 7/1988 |

OTHER PUBLICATIONS

Chinese Office Action dated Jan. 12, 2007 issued in Chinese Application No. 03824140.4.
Patent Abstracts of Japan, Publication No. 2002324901 A, published on Nov. 8, 2002.
Patent Abstracts of Japan, Publication No. 2002184773 A, published on Jun. 28, 2002.
Patent Abstracts of Japan, Publication No. 2002329847 A, published on Nov. 15, 2002.

* cited by examiner

*Primary Examiner*—Alexander G Ghyka
*Assistant Examiner*—Seahvosh J Nikmanesh
(74) *Attorney, Agent, or Firm*—Westerman, Hattori, Daniels & Adrian, LLP.

(57) ABSTRACT

A p-well (12) is formed on a surface of an Si substrate (11) and element isolation insulating films (13) are formed. Next, a thin $SiO_2$ film (14a) is formed on the whole surface, and an oxide film containing a rare earth metal (for example, lanthanum (La) or yttrium (Y)) and aluminum (Al) is formed thereon as an insulating film (14b). Furthermore, a polysilicon film (15) is formed on the insulating film (14b). After that, the $SiO_2$ film (14a) and the insulating film (14b) are allowed to react with each other by performing a heat treatment, for example, at approximately 1000° C. to form a silicate film containing the rare earth metal and Al. In a word, the $SiO_2$ film (14a) and the insulating film (14b) are allowed to be a single silicate film.

9 Claims, 15 Drawing Sheets

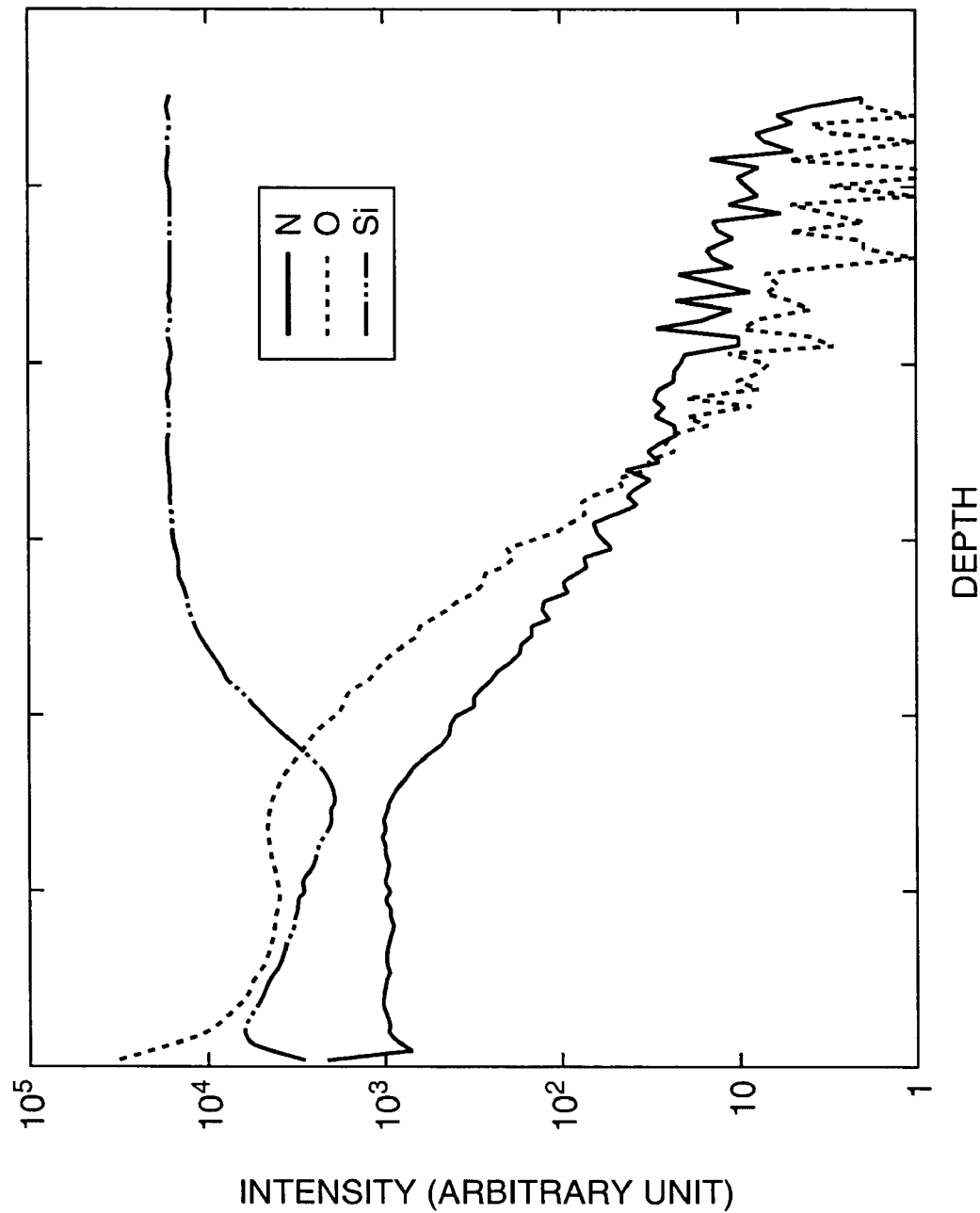

US 7,514,316 B2

SEMICONDUCTOR DEVICE AND METHOD OF MANUFACTURING THE SAME

This application is a continuation of international application PCT/JP2003/003510 filed on Mar. 24, 2003.

TECHNICAL FIELD

The present invention relates to a dielectric film suitable for a MOSFET and a capacitor, a forming method thereof, a semiconductor device having the dielectric film and a manufacturing method of the semiconductor device.

BACKGROUND ART

As a high dielectric constant insulating film used for a gate insulating film of a field-effect transistor such as a MOSFET and the like or a capacity insulating film of a capacitor, an insulating film having higher dielectric constant is required, which is alternative to a silicate oxide film ($SiO_2$ film) and a silicon oxynitride film (SiON film).

As the above high dielectric constant insulating film, a study concerning an insulating film containing a rare earth metal has been made. An $M_2O_3$ film having a simple composition in which the rare earth metal is denoted as "M" is thermally and chemically labile, so that it cannot be used as it is.

Hence, a MOSFET including a multilayer oxide film structure is devised, in which a thin $SiO_2$ film having a good interface state between a silicon substrate and itself is provided on the silicon substrate, and in which a high dielectric constant metal oxide film is formed thereon. In addition, it is proposed that a rare-earth metal oxide film is formed as such metal oxide film.

However, in the multilayer oxide film structure as described above, if a film-forming is performed in a low temperature and a test is performed in a low temperature, an adequate result could be obtained, however, such structure cannot actually be applied to a semiconductor device.

In other words, when an electron device containing various silicon materials is manufactured, high-temperature heat treatments at 600° C. to 1050° C. are frequently performed especially before a metal wiring is formed. Therefore, the high dielectric constant insulating film is required to have tolerance to the high-temperature heat treatment. However, if the high-temperature heat treatment is performed to the aforementioned multilayer oxide film structure, the properties vary during the heat treatment. As a result, problems such as, for example, a deterioration of the interface state and a decrease of the dielectric constant occur.

Patent document 1
Japanese Patent Application Laid-open No. 2002-324901
Patent document 2
Japanese Patent Application Laid-open No. 2002-184773
Patent document 3
Japanese Patent Application Laid-open No. 2002-329847

SUMMARY OF THE INVENTION

An object of the present invention is to provide a dielectric film having a high-temperature tolerance property and a high dielectric constant, a forming method thereof, a semiconductor device including the dielectric film and a manufacturing method thereof.

In a semiconductor device according to the present invention, first and second conductive layers are provided, and a dielectric film containing silicon (Si), a rare earth metal, aluminum (Al) and oxygen (O) is sandwiched between the first and second conductive layers.

In a manufacturing method of the semiconductor device according to the present invention, a first insulating film containing silicon (Si) is formed on a first conductive layer. Next, a second insulating film containing a rare earth metal, aluminum (Al) and oxygen (O) is formed on the first insulating film. Then, the first insulating film is allowed to react with the second insulating film by a heat treatment to thereby form a dielectric film containing Si, rare earth metal, Al and O.

A dielectric film according to the present invention contains silicon (Si), a rare earth metal, aluminum (Al) and oxygen (O).

In a forming method of the dielectric film according to the present invention, a first insulating film containing silicon (Si) is formed. Next, a second insulating film containing a rare earth metal, aluminum (Al), and oxygen (O) is formed on the first insulating film. Then, the first insulating film is allowed to react with the second insulating film by a heat treatment to thereby allow the first insulating film and the second insulating film to be a single film.

BRIEF DESCRIPTION OF THE DRAWINGS

FIG. 10 is a graph showing a relation between a depth and SIMS intensity;

DETAILED DESCRIPTION OF THE PREFERRED EMBODIMENTS

As a result of the investigation regarding the reason why the properties in a conventional structure of a multilayer oxide film vary by a high-temperature heat treatment, the present inventor fount out that a silicon oxide film and a rare-earth metal oxide film react with each other.

Figure 1:
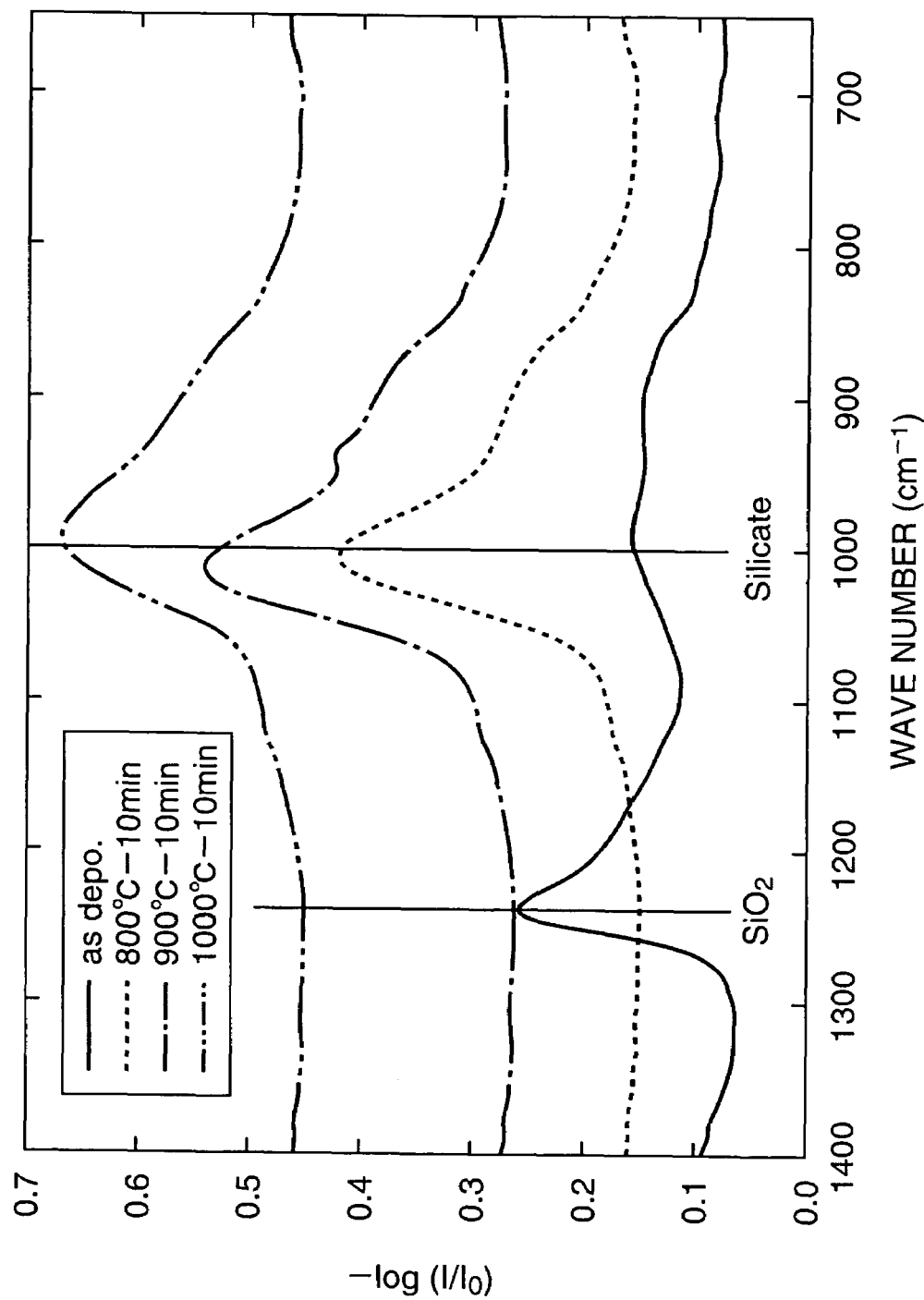
FIG. 1 is a graph showing results of a change in a heat treatment of an $La_2O_3$ film formed on an Si substrate via a natural oxide film, which are evaluated by an infrared absorption method.

FIG. 1 is a graph showing results of change in a heat treatment of an $La_2O_3$ film formed on an Si substrate via a natural oxide film, which are evaluated by an infrared absorption method (FTIR). $La_2O_3$ is a typical rare earth oxide. FIG. 1 shows results when the $La_2O_3$ film was formed at 500° C. A solid line shows a result of a specimen to which the heat treatment was not applied after formed, a dotted line shows a result of the specimen to which the heat treatment at 800° C. for 10 minutes was performed after formed, a chain line shows a result of the specimen to which the heat treatment at 900° C. for 10 minutes was performed after formed, and a chain double-dashed line shows a result of the specimen to which the heat treatment at 1000° C. for 10 minutes was performed after formed. Note that the thickness of the natural oxide film is approximately 1 nm, and the thickness of the $La_2O_3$ film is 40 nm.

As shown in FIG. 1, a peak of $SiO_2$ showing the existence of the natural oxide film is prominent before the heat treatment. However, by the heat treatment at mere 800° C., the peak disappears completely, and the peak of a silicate of lanthanum (La) becomes prominent. The silicate is a composite oxide of silica ($SiO_2$) and $La_2O_3$.

Figure 2:
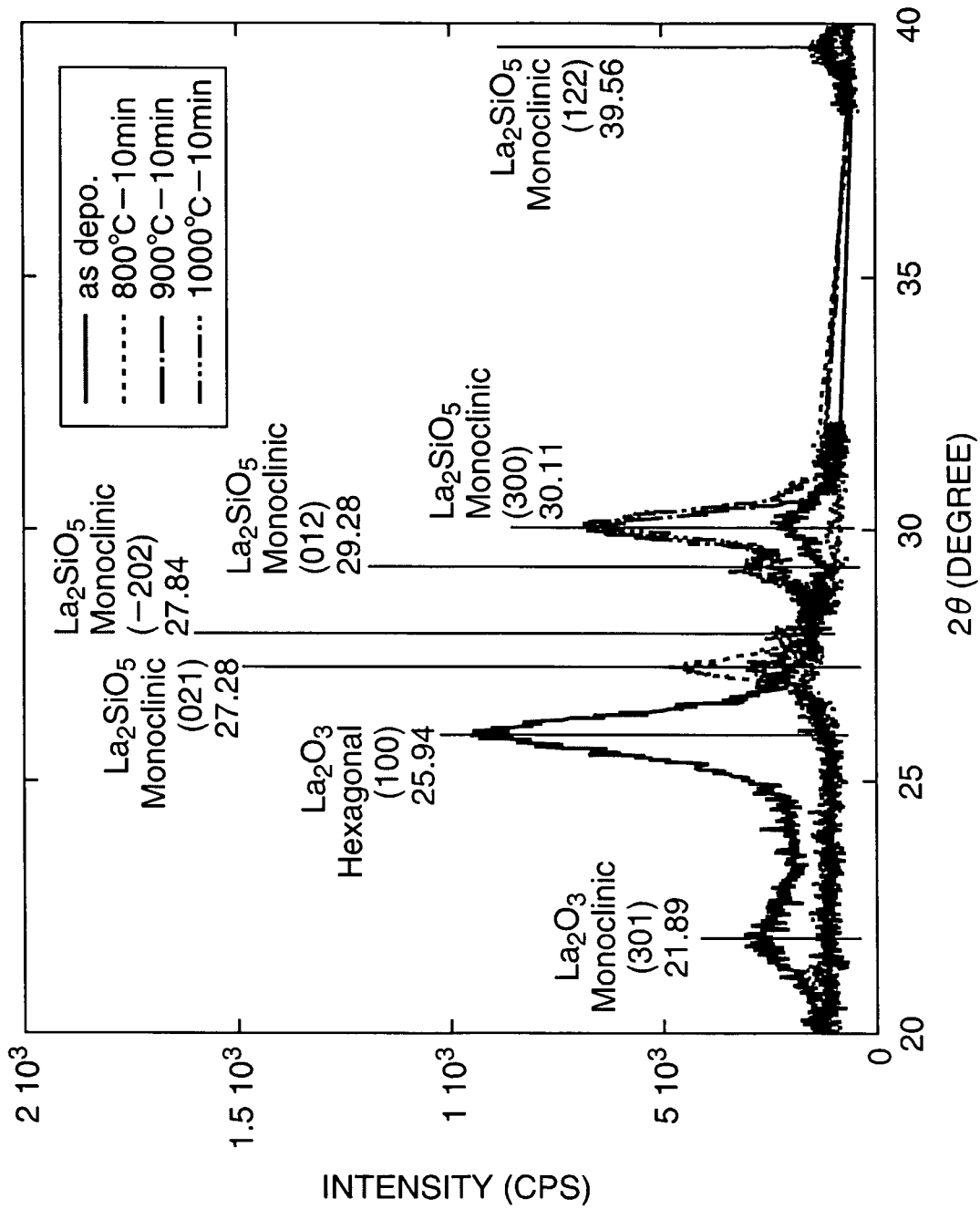
FIG. 2 is a graph showing X-ray diffraction spectra of respective films used in the evaluation shown in FIG. 1.

FIG. 2 is a graph showing X-ray diffraction spectra of respective films used in the evaluation shown in FIG. 1. The peaks (2θ=21.89, 25.94) showing the existence of $La_2O_3$ are prominent. However, after the heat treatments at 800° C. or more, these peaks disappear, and peaks (2θ=27.28, 30.11 and so on) showing the existence of a silicate crystal ($La_2SiO_5$) which is thermodynamically stable are prominent.

As can be seen from the results shown in FIG. 1 and FIG. 2, in the multilayer oxide film to which the $La_2O_3$ film is used, the natural oxide film and the $La_2O_3$ film react with each other by the high-temperature heat treatment. Since the thickness of the $La_2O_3$ film is 40 nm, silicon (Si) is insufficient with Si in the natural oxide film alone. In a word, $La_2SiO_5$ requires the number of Si atoms of ½ of the number of La atoms, however, sufficient Si atoms does not exist in the natural oxide film. Therefore, a shortfall of Si is compensated from the Si substrate.

On the other hand, in a common manufacturing method of a semiconductor device, various kinds of high-temperature heat treatment are performed in a state that a MOS transistor is covered with an interlayer insulating film and the like. Thus, oxygen does not supplied from the outside so that the generated $La_2Si_5$ film runs short of the oxygen, as a result, insulation quality of film is deteriorated drastically.

In addition, an interface characteristic (interface state) also deteriorates drastically with the disappearance of the natural oxide film.

In order to stably manufacture the semiconductor device including the MOSFET having a gate insulating film of the multilayer oxide film structure being composed of the $SiO_2$ film and the rare-earth metal oxide film, after the gate insulating film is formed, a low-temperature processing at 500° C. to 600° C. or less alone can be possible. Whereas, in order to manufacture a conventional semiconductor device including a MOSFET having a gate electrode composed of polysilicon, the heat treatments at 800° C. or more are frequently required. In short, the conventional gate insulating film having the multilayer oxide film structure cannot be applied for the MOSFET including the gate electrode composed of the polysilicon.

As a result of repeated studies in consideration of such experimental results by the present inventor to obtain high tolerance properties for the high temperature with the high dielectric constant obtained at the same time in the gate insulating film (dielectric film), the present inventor found out that extremely high dielectric constant can be obtained, and the deterioration of the interface characteristic can be prevented by applying a silicon oxide film containing not only a rare earth metal but also aluminum (Al) as the gate insulating film. And further, the silicon oxide film containing the rare earth metal and Al is also preferable for a capacity insulating film of a capacitor.

Figure 3:
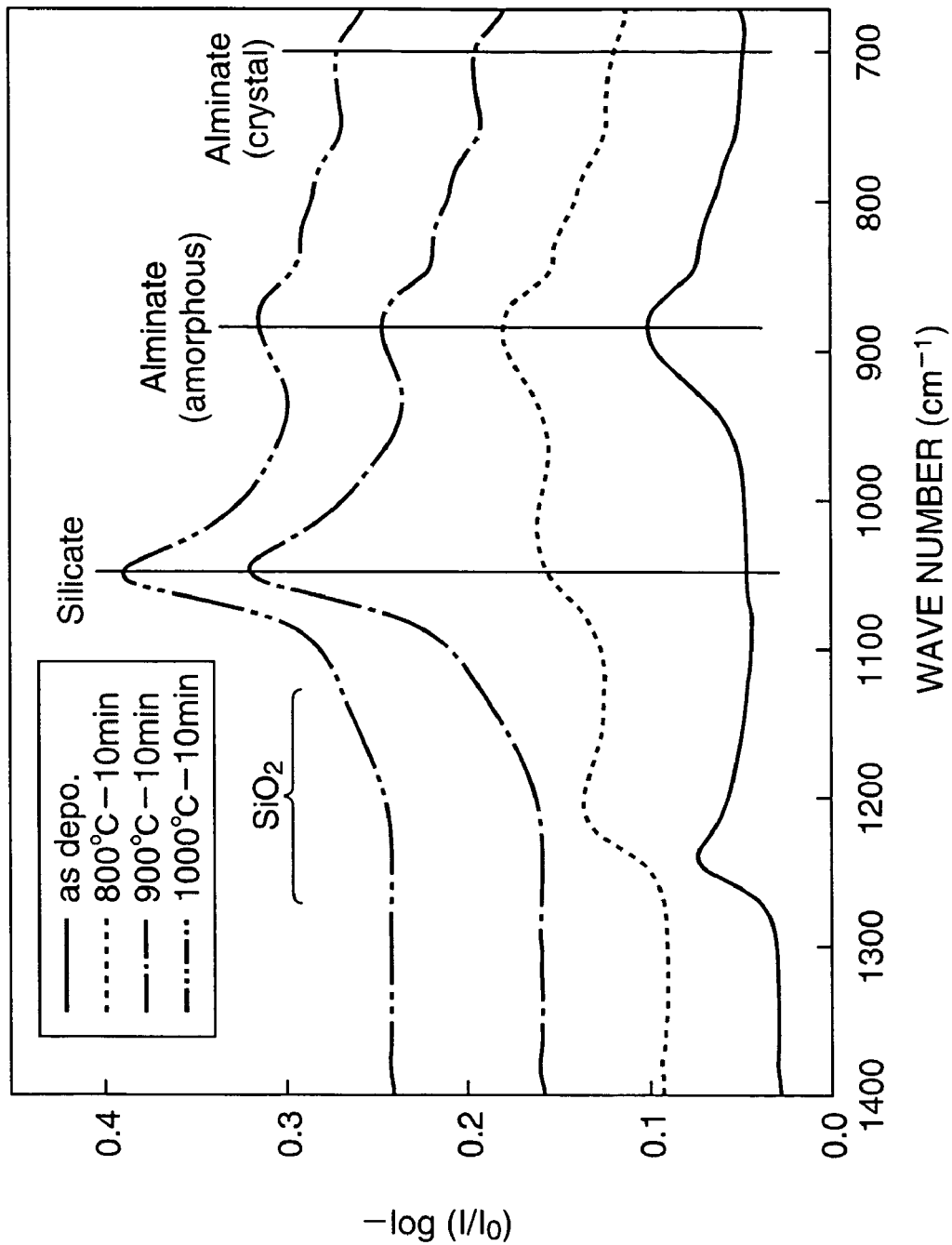
FIG. 3 is a graph showing results of a change in the heat treatment of an yttrium aluminate film formed on an Si substrate via a natural oxide film, which are evaluated by an infrared absorption method.

FIG. 3 is a graph showing results of change in the heat treatment of an yttrium aluminate ($Y_xAl_yO_z$) film (thickness: 42 nm) formed on an Si substrate via a natural oxide film, which are evaluated by an infrared absorption method (FTIR). The number of aluminum (Al) atoms is ½ of the number of yttrium (Y) atoms. FIG. 3 shows the results when the $Y_xAl_yO_z$ film was formed at 500° C. As same as FIG. 1, a solid line shows a result of a specimen to which the heat treatment was not applied after formed, a dotted line shows a result of the specimen to which the heat treatment at 800° C. for 10 minutes was performed after formed, a chain line shows a result of the specimen to which the heat treatment at 900° C. for 10 minutes was performed after formed, and a chain double-dashed line shows a result of the specimen to which the heat treatment at 1000° C. for 10 minutes was performed after formed.

As shown in FIG. 3, a peak of $SiO_2$ showing the existence of the natural oxide film is prominent before the heat treatment. However, the peak decreases by the heat treatment at mere 800° C., and when the peak disappears completely by the heat treatment at 900° C., the peaks of silicate becomes prominent. The silicate is a composite oxide of silica ($SiO_2$) and $Y_xAl_yO_z$. Peaks showing the existence of $Y_xAl_yO_z$ as being aluminate of the rare earth metal appear in all temperatures.

Figure 4:
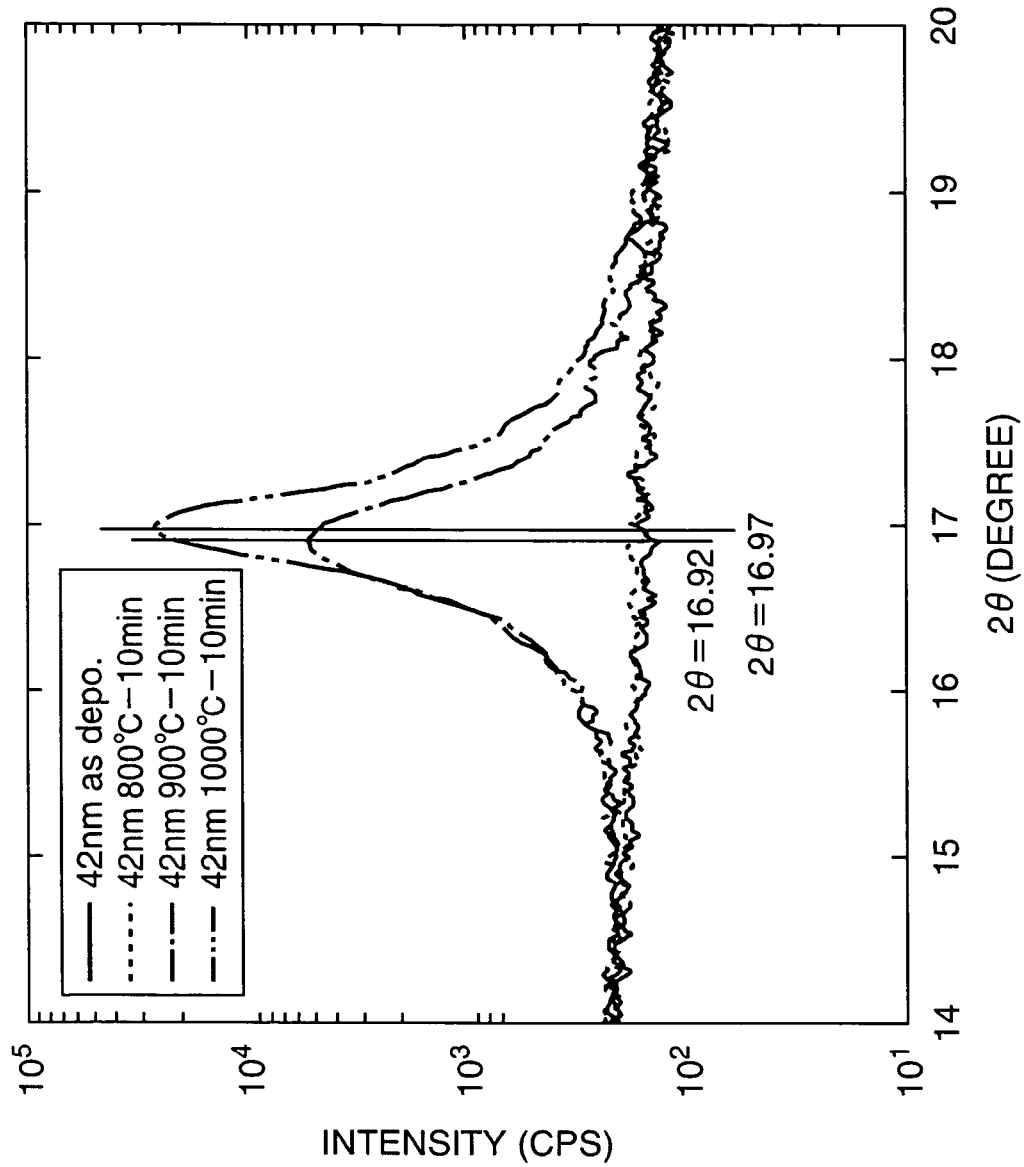
FIG. 4 is a graph showing X-ray diffraction spectra of respective films used in the evaluation shown in FIG. 3.

FIG. 4 is a graph showing X-ray diffraction spectra of respective films used in the evaluation shown in FIG. 3. And FIG. 5 is a graph showing X-ray diffraction spectra obtained when the $Y_xAl_yO_z$ film has a film thickness of 6 nm.

Figure 5:
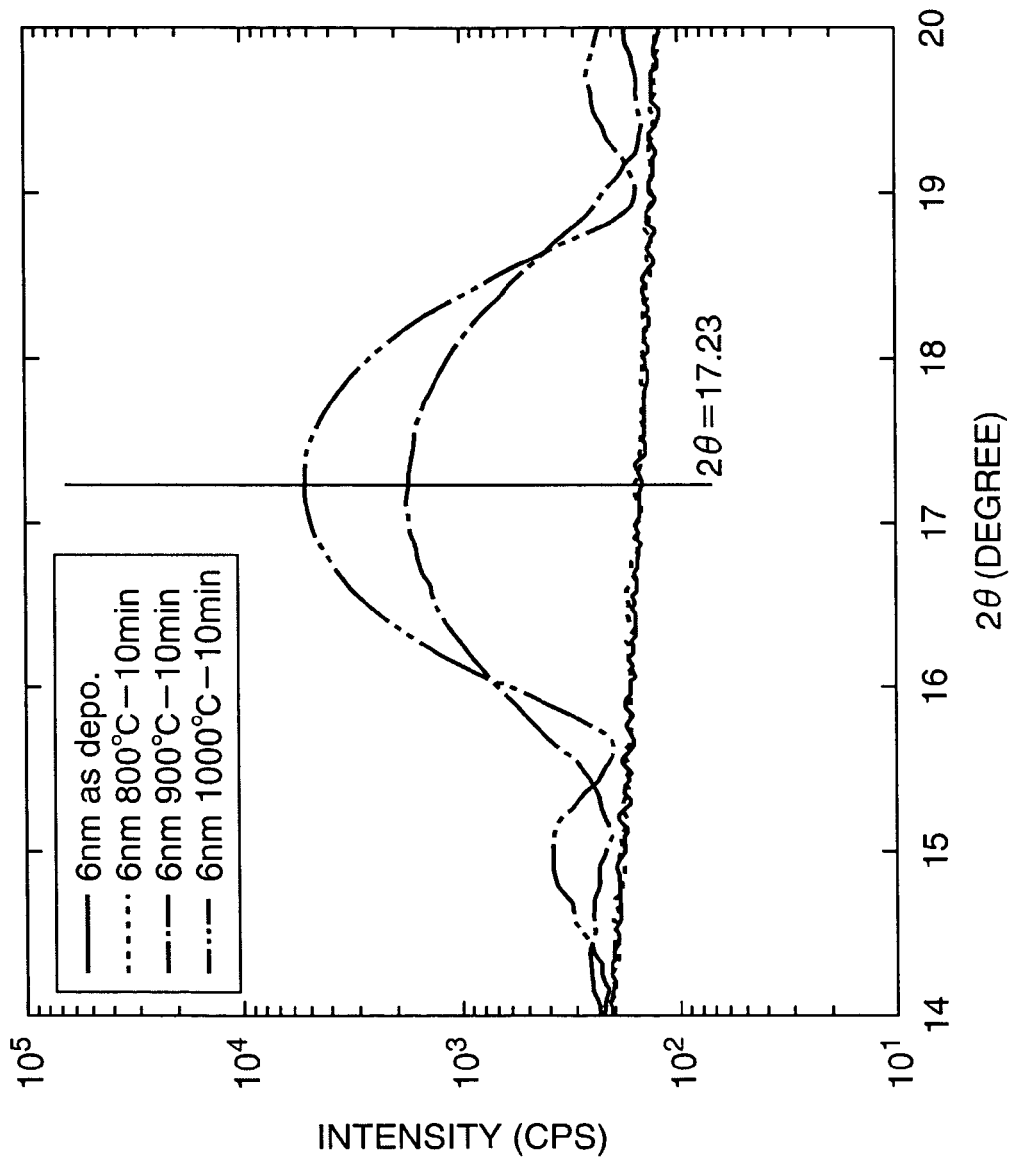
FIG. 5 is a graph showing X-ray diffraction spectra obtained when $Y_xAl_yO_z$ has a film thickness of 6 nm.

As shown in FIG. 4 and FIG. 5, a prominent peak did not exist before the heat treatment regardless of the film thickness, and the formed yttrium aluminate film was in an amorphous state. The state was maintained after the heat treatment at 800° C. was performed. When the heat treatment at 900° C. or more was performed, $Y_xAl_yO_z$ containing several percent of silicon was crystallized.

Figure 6:
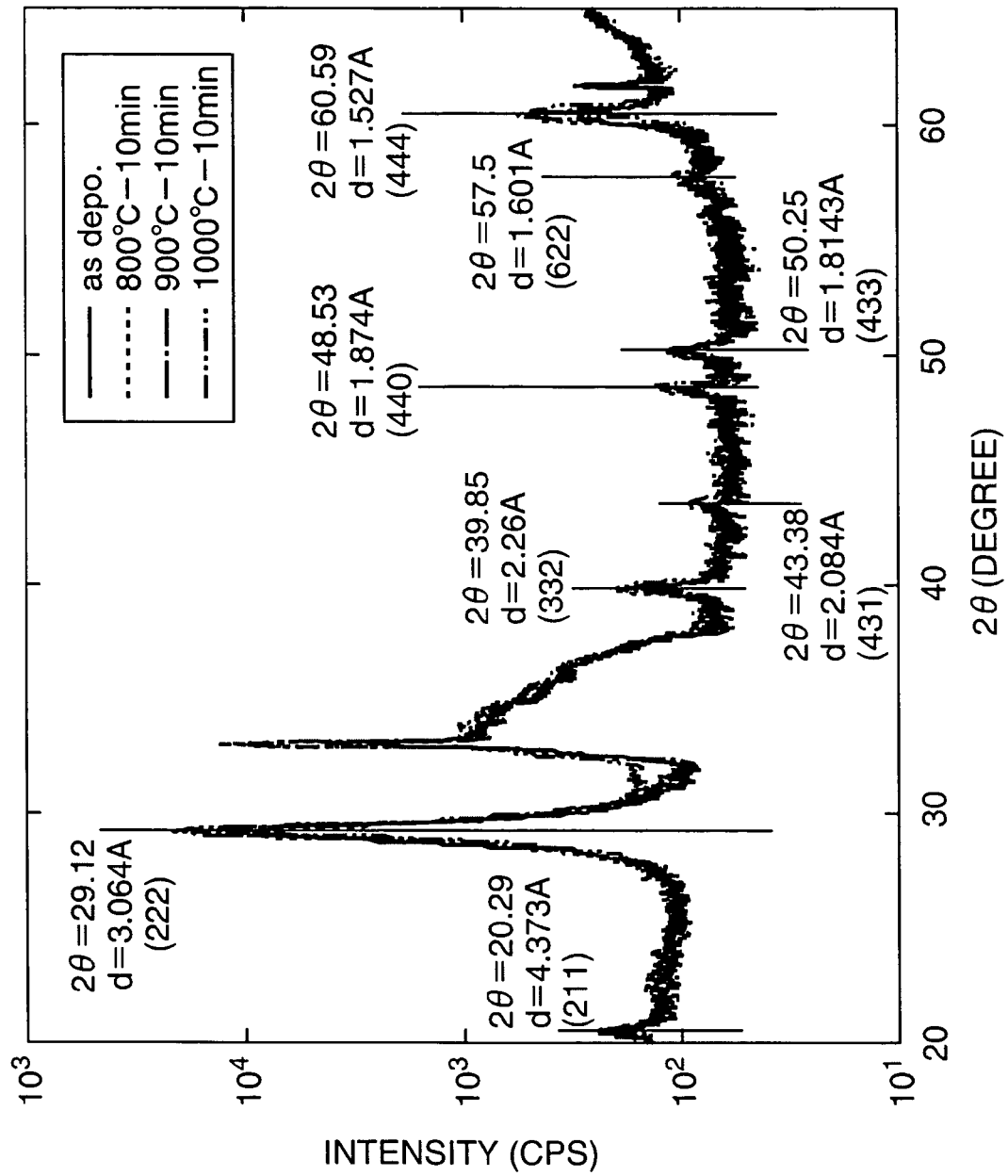
FIG. 6 is a graph showing X-ray diffraction spectra of an $Y_2O_3$ film (thickness: 41 nm) not containing aluminum (Al)

For reference, X-ray diffraction spectra of an $Y_2O_3$ film (thickness: 41 nm) not containing aluminum (Al) is shown in FIG. 6. As shown in FIG. 6, the $Y_2O_3$ film had already crystallized in a state of being film-formed at 500° C. Therefore, as can be seen comparison between FIG. 4, FIG. 5, and FIG. 6, the crystallization is suppressed by allowing Al to be contained. An amorphous film in which a grain boundary does not exist inside is extremely suitable for the capacity insulating film of the capacitor.

Some embodiments of the present invention based on the above knowledge will be specifically described with reference to the drawings as follows.

First Embodiment

Figure 7A:
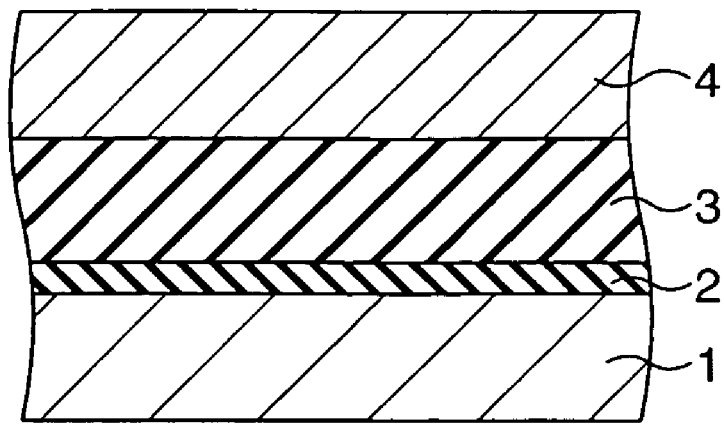
FIG. 7A and FIG. 7B are sectional views showing a manufacturing method of a semiconductor device according to a first embodiment of the present invention in order of process.
Figure 7B:
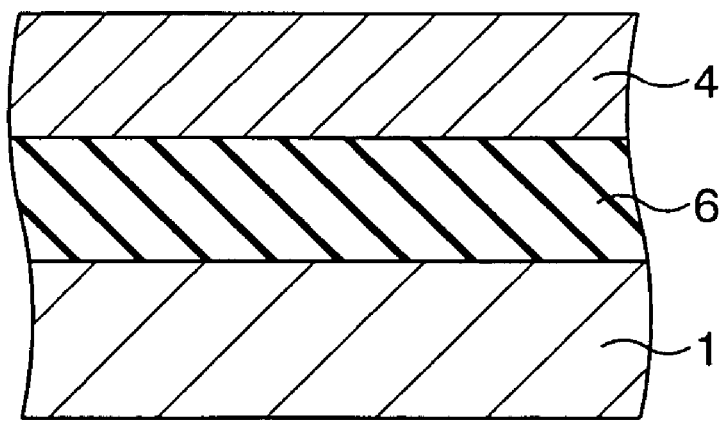

First, a first embodiment of the present invention will be described. In this case, a part of a structure of a semiconductor device is explained with a forming method thereof for convenience. FIG. 7A and FIG. 7B are sectional views showing a manufacturing method of a semiconductor device according to the first embodiment of the present invention in order of process.

In the first embodiment, first, as shown in FIG. 7A, an $SiO_2$ film 2 is formed on an Si substrate 1. The thickness of the $SiO_2$ film 2 is, for example, approximately 1 nm. A natural oxide film can be used as the $SiO_2$ film 2 as it is. Next, an insulating film 3 is formed as an oxide film containing a rare earth metal and aluminum (Al) on the $SiO_2$ film 2. The thickness of the insulating film 3 is, for example, approximately 3 nm. After that, a polysilicon film 4 is formed on the insulating film 3.

Subsequently, a heat treatment, for example, at 700° C. and above in an oxygen atmosphere is performed to the layered stack. As a result, as shown in FIG. 7B, the $SiO_2$ film 2 and the insulating film 3 react with each other, and an insulative silicate film (dielectric film) 6 containing the rare earth metal and Al is formed. The silicate film 6 is not a multilayer-structured insulating film conventionally proposed but a complex single-layer film having four or more elements.

After that, a MOSFET in which the silicate film 6 is a gate insulating film can be formed by patterning the polysilicon film 4 to be a planar shape of a gate electrode.

And further, the semiconductor device can be completed with an impurity diffusion layer and an interlayer insulating film and the like being formed.

In such first embodiment, the silicate film 6 is formed with the $SiO_2$ film 2 and the insulating film 3 reacting with each other, however, the insulating film 3 contains Al so that an introducing amount of silicon (Si) from the Si substrate 1 is extremely small. Namely, there exists little room for introducing Si into the silicate film 6. Therefore, the decrease of a dielectric constant can be avoided. In addition, the deterioration of an interface state is also prevented.

In the first embodiment, a composition and the introducing amount of Si from the Si substrate 1 in the silicate film 6 can be controlled by the thickness of the $SiO_2$ film 2, the thickness of the insulating film 3 and the composition of the insulating film 3.

Figure 8:
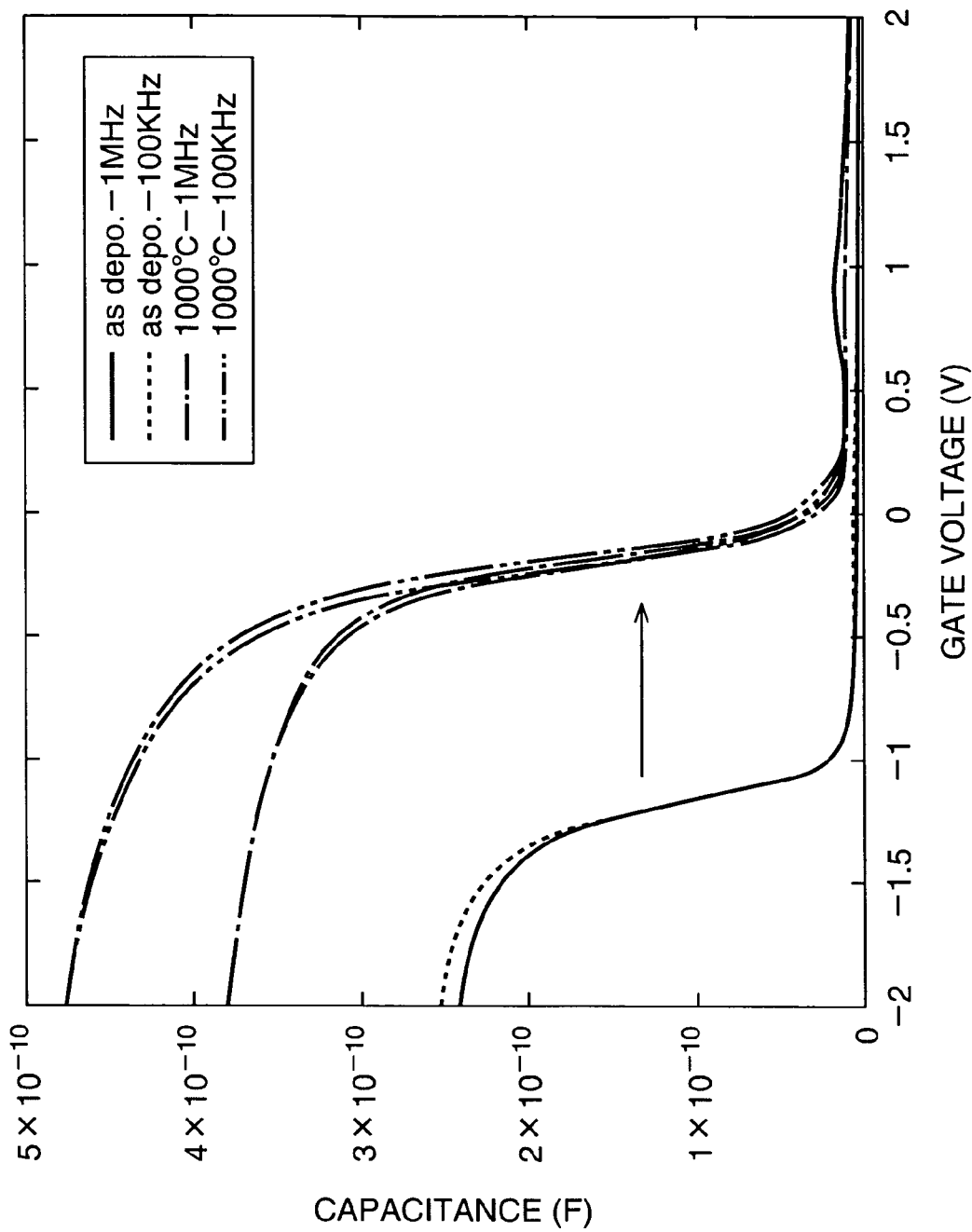
FIG. 8 is a graph showing a high frequency CV characteristic of a MOSFET actually fabricated based on the first embodiment.

FIG. 8 is a graph showing a high-frequency CV characteristic of a MOSFET actually fabricated based on the first embodiment. Results shown in FIG. 8 were obtained when the insulating film 3 having a thickness of 6 nm was formed and a platinum (Pt) electrode was formed as the gate electrode in a state that the Si substrate 1 having a surface plane direction of (100) was used with the natural oxide film formed thereon. Note that the heat treatment temperature was 1000° C. and the insulating film 3 contained yttrium (Y) as the rare earth metal.

As shown in FIG. 8, the high dielectric constant and good high-frequency CV characteristic could be obtained regardless of the high-temperature heat treatment up to 1000° C. Namely, a hysteresis hardly occurred, and the increase of a leak current was also small. Little decrease of the dielectric constant by the heat treatment means that the Si amount introduced to the silicate film from the Si substrate was properly controlled. In a word, according to the first embodiment, a high dielectric constant thin film having a good insulating characteristic with the complex composition controlled based on the thickness of the $SiO_2$ film or the like.

Second Embodiment

Figure 9A:
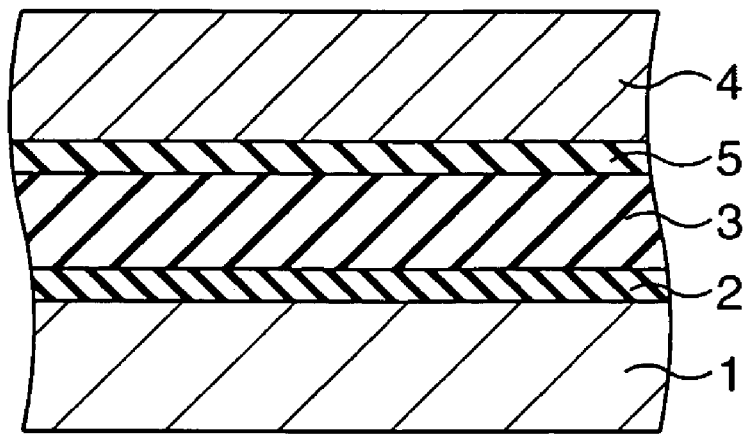
FIG. 9A and FIG. 9B are sectional views showing a manufacturing method of a semiconductor device according to a second embodiment in order of process.
Figure 9B:
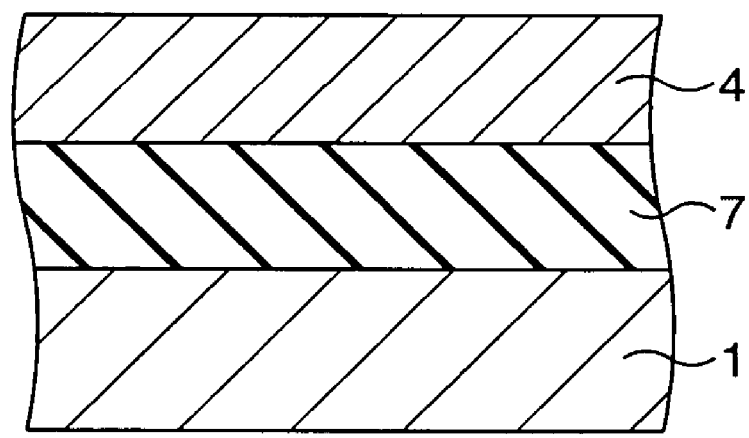

Next, a second embodiment of the present invention will be described. Also in this case, a part of a structure of a semiconductor device is explained with a forming method thereof for convenience. FIG. 9A and FIG. 9B are sectional views showing a manufacturing method of a semiconductor device according the second embodiment of the present invention in order of process.

In the second embodiment, first, as shown in FIG. 9A, an insulating film 2 is formed on an Si substrate 1. The thickness of the insulating film 2 is, for example, approximately 1 nm. A natural oxide film can be used as the insulating film 2 as it is, or an $SiO_2$ film, an SiN film, or an SiON film can be formed. Next, an insulating film 3 is formed as an oxide film containing a rare earth metal and aluminum (Al) on the insulating film 2. The thickness of the insulating film 3 is, for example, approximately 6 nm. After that, an Si nitride film ($SiN_x$ film) 5 is formed on the insulating film 3, and a polysilicon film 4 is formed thereon.

Subsequently, a heat treatment, for example, at 700° C. and above in an oxygen atmosphere is performed to the layered stack. As a result, as shown in FIG. 9B, the insulating film 2, the insulating film 3 and the Si nitride film 5 react with each other, and an insulative silicate film (dielectric film) 7 containing the rare earth metal, Al and nitrogen (N) is formed. The silicate film 7 is not a multilayer-structured insulating film conventionally proposed but a complex single-layer film having five or more elements.

Also according to the second embodiment thus described, the same effect as the first embodiment can be obtained. Owing to the presence of nitrogen (N), a crystallization of the silicate film 7 is suppressed so that the silicate film is in an amorphous state. Therefore, a leak current can be suppressed more efficiently.

FIG. 10 is a graph showing a relation between a depth and SIMS (secondary ion mass spectrometry) intensity. The graph shown in FIG. 10 was obtained after the heat treatment at 1000° C. for ten minutes with respect to a specimen in which the Si nitride film was provided between a $Y_2O_3$ film and the Si substrate.

As shown in FIG. 10, in a shallow part, that is, in the silicate film generated with the $Y_2O_3$ film and the Si nitride film reacting with each other, nitrogen (N) existed with almost constant concentration. In the specimen used for the experiment shown in FIG. 10, a rare-earth metal oxide film not containing Al was formed, however, when the rare-earth metal oxide film containing Al is formed as in the second embodiment, the same result is supposed to be obtained. The result means that the silicate film in which N is contained in a desired concentration almost uniformly can be obtained by performing the heat treatment with a film containing N in a suitable concentration, for example, an SiN film or an SiON film in a suitable thickness formed between the Si substrate and the rare-earth metal oxide film. In addition, such silicate film is amorphous, therefore a grain boundary does not exist. Namely, a channel of the leak current does not exist, thus the leak current is suppressed.

In the second embodiment, since the Si nitride film 5 is formed between the insulating film 3 and the polysilicon film 4, the Si nitride film 5 is also a supply source of N to the silicate film 7. Therefore, in the second embodiment, a composition and an introducing amount of silicon (Si) from the Si substrate 1 in the silicate film 7 can be controlled by the thickness of the insulating film 2, the thickness of the insulating film 3, the composition of the insulating film 3 and the thickness of the Si nitride film 5.

Additionally, in the first and second embodiments, the heat treatment is performed after the polysilicon film 4 is formed, however, it can be performed before the polysilicon film 4 is formed.

Furthermore, in the first and second embodiments, the atmosphere in which the insulating film 3 and the polysilicon film 4 (and the Si nitride film 5) are allowed to react with each other is the oxygen atmosphere. The purpose of this is to prevent the silicate films 6 and 7 from being short of oxygen, because a little Si may be introduced to the Si substrate 1.

Next, a manufacturing method of a MOSFET and a manufacturing method of a capacitor employing the first embodiment will be explained.

Figure 11A:
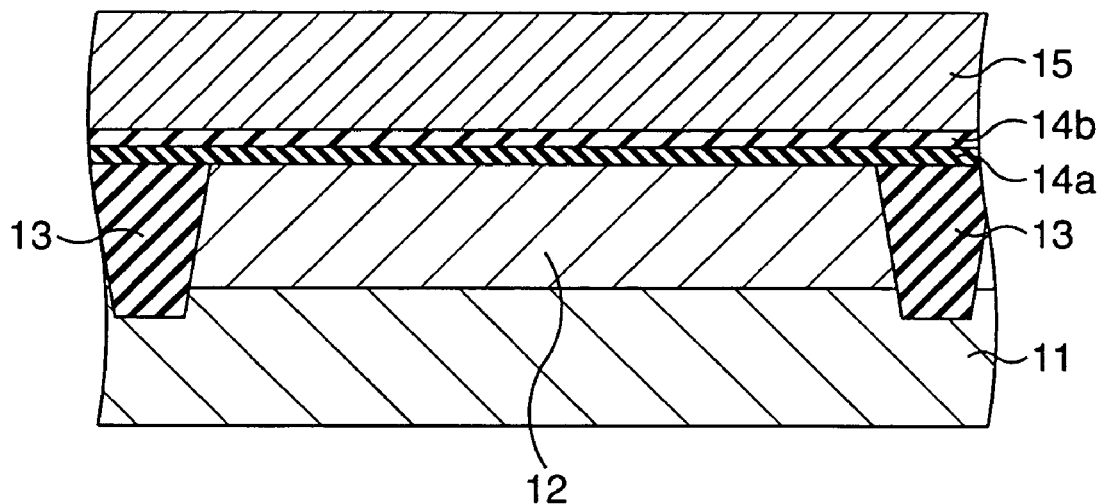
FIG. 11A to FIG. 11D are sectional views showing a method of manufacturing a MOSFET with the present invention employed in order of process.

In the case of manufacturing the MOSFET, first, as shown in FIG. 11A, a p-well 12 is formed on a surface of a semiconductor substrate 11 and element isolation insulating films 13 are formed. Next, a thin $SiO_2$ film 14a is formed on the whole surface, and an oxide film containing a rare earth metal (for example, lanthanum (La) or yttrium (Y)) and aluminum (Al) is formed thereon as an insulating film 14b. And further, a polysilicon film 15 is formed on the insulating film 14b. Note that the natural oxide film can be used as the $SiO_2$ film 14a.

Figure 11B:
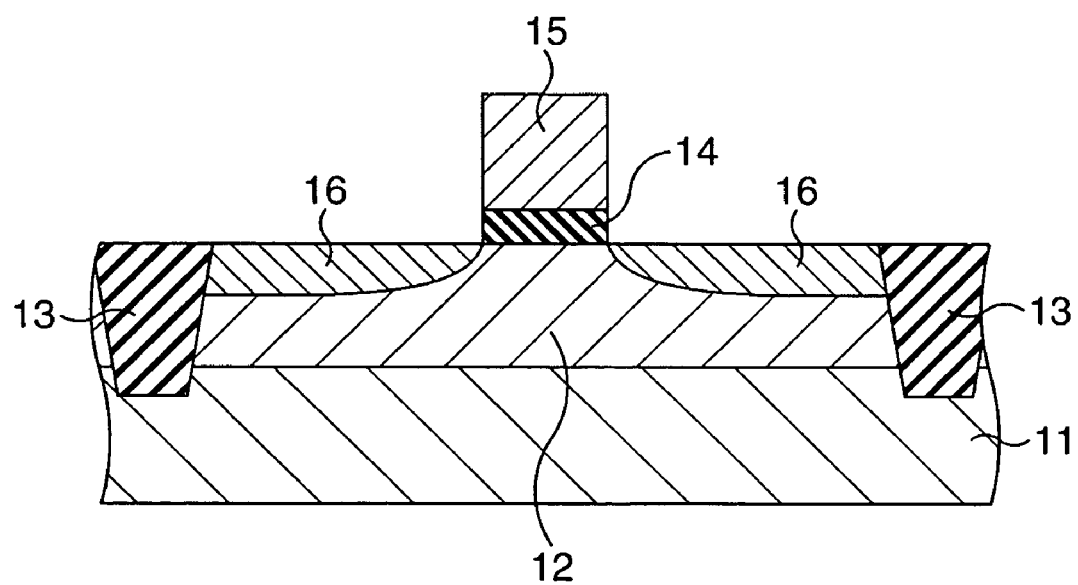

After that, the $SiO_2$ film 14a is allowed to react with the insulating film 14b by performing the heat treatment, for example, at approximately 1000° C. to form a silicate film 14 containing the rare earth metal and Al as shown in FIG. 11B. In a word, the $SiO_2$ film 14a and the insulating film 14b are allowed to be the single silicate film 14. Subsequently, the polysilicon film 15 and the silicate film 14 are patterned to be the planar shape of a gate electrode. Next, low-concentration diffusion layers 16 are formed by ion implanting an n-type impurity, for example, phosphorus (P).

Figure 11C:
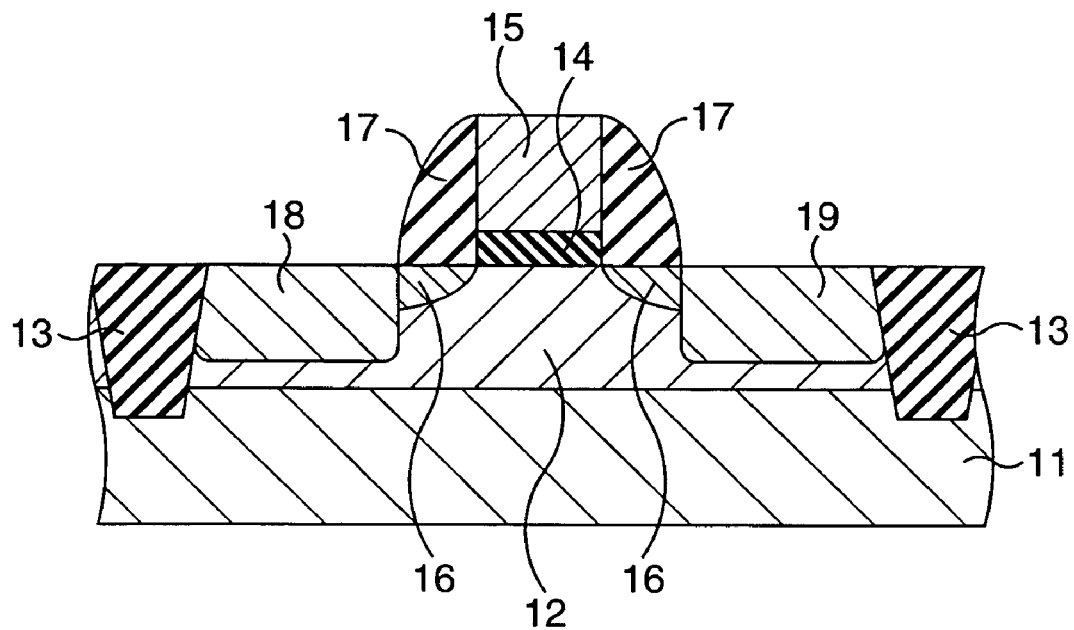

Next, as shown in FIG. 11C, sidewall insulating films 17 are formed at the sides of the gate electrode (polysilicon film 15). After that, a source diffusion layer 18 and a drain diffusion layer 19 are formed by ion implanting an n-type impurity with a higher dose amount than the amount when forming the low-concentration diffusion layers 16.

Figure 11D:
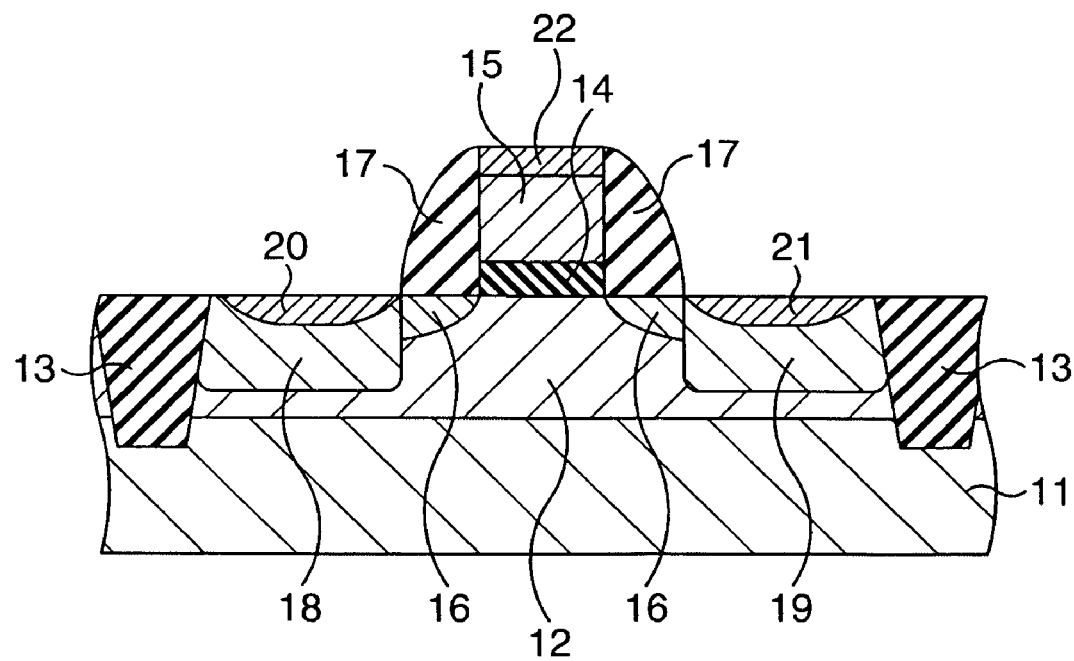

Subsequently, as shown in FIG. 11D, cobalt silicide layers 20, 21, and 22 are formed on the surfaces of the source diffusion layer 18, the drain diffusion layer 19 and the gate electrode (polysilicon film 15) respectively.

Then, though not shown, an interlayer insulating film, wiring and the like are formed.

Figure 12A:
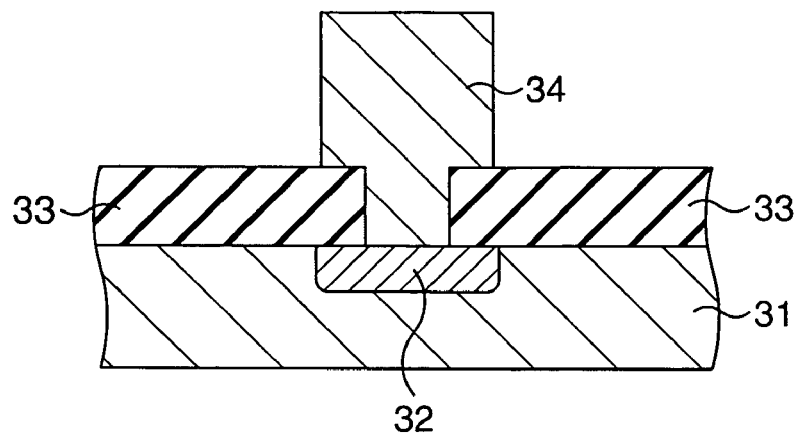
FIG. 12A to FIG. 12C are sectional views showing a method of manufacturing a capacitor with the present invention employed in order of process.

In the case of manufacturing a capacitor, first, as shown in FIG. 12A, an $N^+$ layer 32 is formed on an Si substrate 31, and an interlayer insulating film 33 is formed on the whole surface. Next, a contact hole reaching the $N^+$ layer 32 is formed in the interlayer insulating film 33. Subsequently, a bottom electrode 34 connected to the $N^+$ layer 32 through the contact hole is formed on the interlayer insulating film 33. The bottom electrode 34 is made of, for example, a polysilicon film.

Figure 12B:
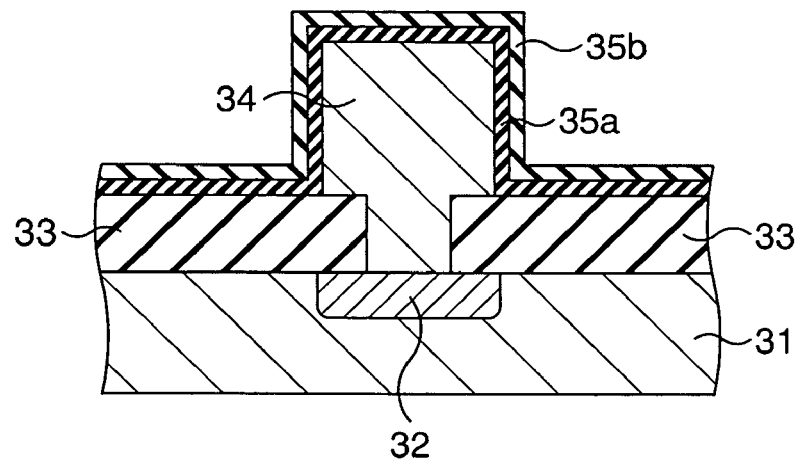

After that, as shown in FIG. 12B, a thin $SiO_2$ film 35a is formed on the whole surface, and an oxide film containing a rare earth metal (for, example, lanthanum (La) or yttrium (Y)) and aluminum (Al) is formed as an insulating film 35b.

Figure 12C:
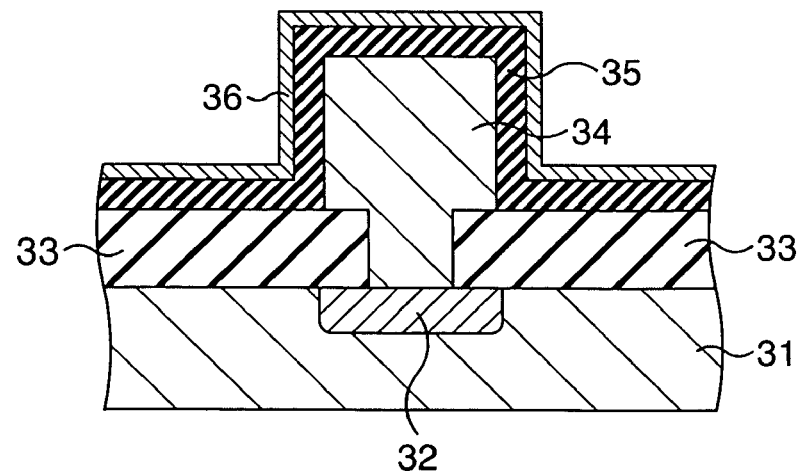

Subsequently, as shown in FIG. 12C, a top electrode 36 is formed on the insulating film 35b. Next, a silicate film 35 containing the rare earth metal and Al is formed with the $SiO_2$ film 35a allowed to react with the insulating film 35b by performing the heat treatment, for example, at approximately 800° C. In a word, the $SiO_2$ film 35a and the insulating film 35b are allowed to be a single silicate film 35.

Then, though not shown, an interlayer insulating film, wiring and the like are formed.

Note that the second embodiment can be applied to the manufacturing method of the MOSFET and the manufacturing method of the capacitor instead of the first embodiment.

Next, an aluminum (Al) content will be described. In a conventional multilayer structured insulating film, approximately ½ of the number of silicon (Si) atoms with respect to the rare earth metal atoms are introduced to the rare-earth metal oxide film by the high-temperature heat treatment required for manufacturing a common device containing Si. On the other hand, by allowing Al to be aluminate with the rare earth metal oxide film allowed to contain Al in advance, the Si amount to be introduced to the rare-earth metal oxide film during the heat treatment can be controlled. In the case that the number of Al atoms contained in the rare-earth metal oxide film is larger than the number of the rare earth metal atoms, a reaction of the rare-earth metal oxide film such as the natural oxide film and the insulating film existing between the Si substrate and itself, of which dielectric constant is low, becomes insufficient so that the insulating film having the low dielectric constant remains, resultingly a high dielectric constant hardly be obtained. Therefore, it is preferable that the number of Al atoms is smaller than the number of the rare earth metal atoms. On the other hand, if the number of Al atoms is smaller than ½ of the number of rare earth metal atoms, the Si amount to be introduced from the Si substrate tends to increase. Therefore, it is preferable that the number of Al atoms is more than ½ of the number of rare earth metal atoms. By using the rare earth metal oxide having such composition, a generation of low dielectric-constant layer can be suppressed and a single layer complex composite oxide film can be obtained.

As the rare earth metal, any of these among Y, La, Ce, Pr, Nd, Sm, Eu, Gd, Tb, Dy, Ho, Er, Tm, Yb and Lu can be used.

Figure 13:
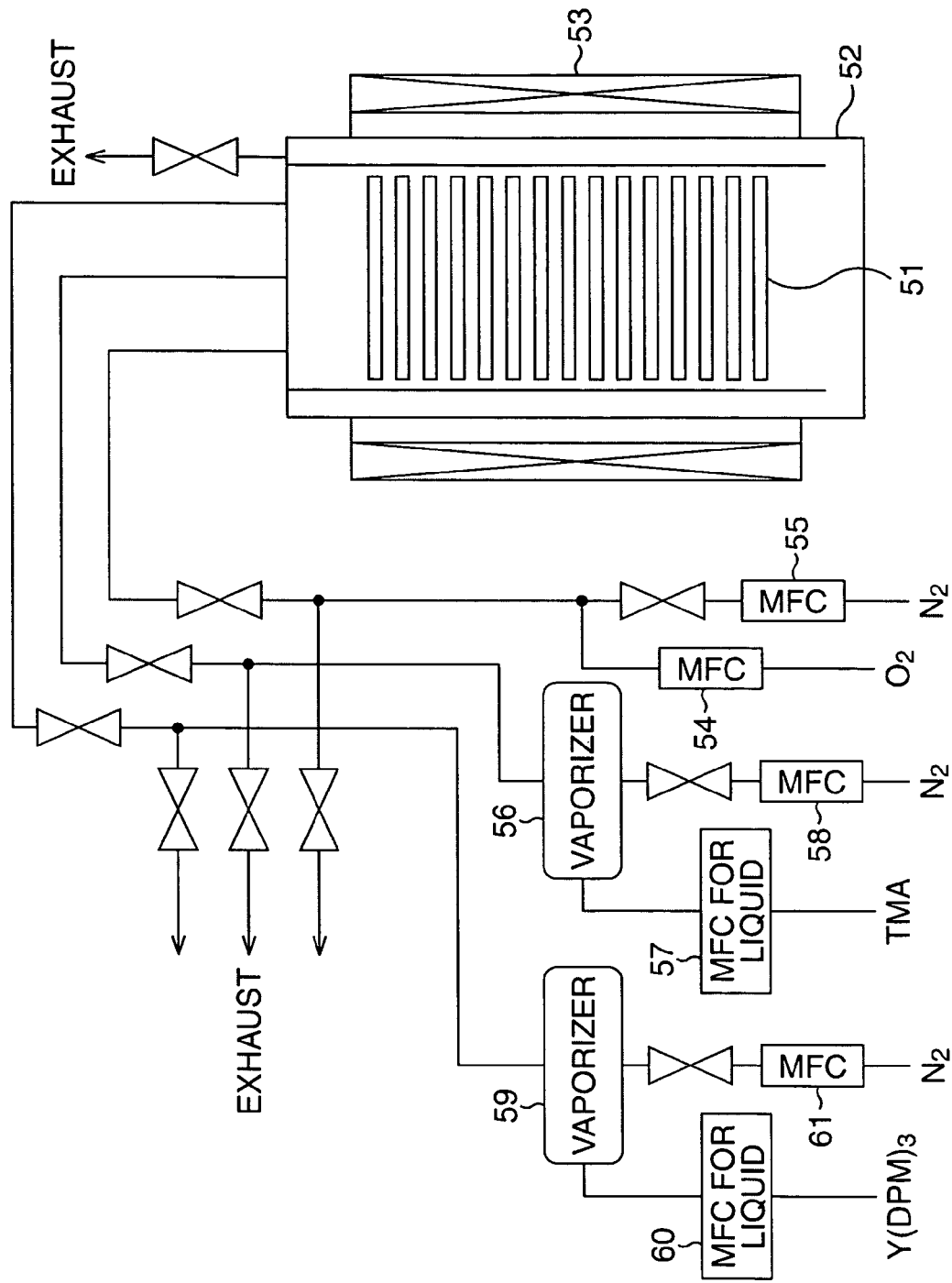
FIG. 13 is a schematic diagram showing a batch-mode system.

An apparatus suitable for forming a silicon oxide film including a rare earth metal such as yttrium (Y) and aluminum (Al) will be explained. FIG. 13 is a schematic diagram showing a batch-mode system and FIG. 14 is a schematic diagram showing a single-wafer system.

In the batch-mode system, as shown in FIG. 13, a film-forming chamber 52 in which plural numbers of Si wafers (Si substrates) are to be housed is provided, and a heater 53 is arranged around the film-forming chamber 52. A supply pipe for $O_2$, a supply pipe for TMA (trimethyl aluminum), and a supply pipe for $Y(DPM)_3$ (yttrium dipivaloylmethanato) are connected to the film-forming chamber 52. As a solvent for the $Y(DPM)_3$, for example, THF (tetrahydrofuran) is used. A mass flow controller (MFC) 54 for $O_2$ and a mass flow controller (MFC) 55 for $N_2$ are provided to the supply pipe for the $O_2$. A vaporizer 56, a liquid MFC for the TMA 57 and a MFC 58 for the $N_2$ are provided to the supply pipe for the TMA. A vaporizer 59, a liquid MFC 60 for the $Y(DPM)_3$ and a MFC 61 for the $N_2$ are provided to the supply pipe for the $Y(DPM)_3$.

Figure 14:
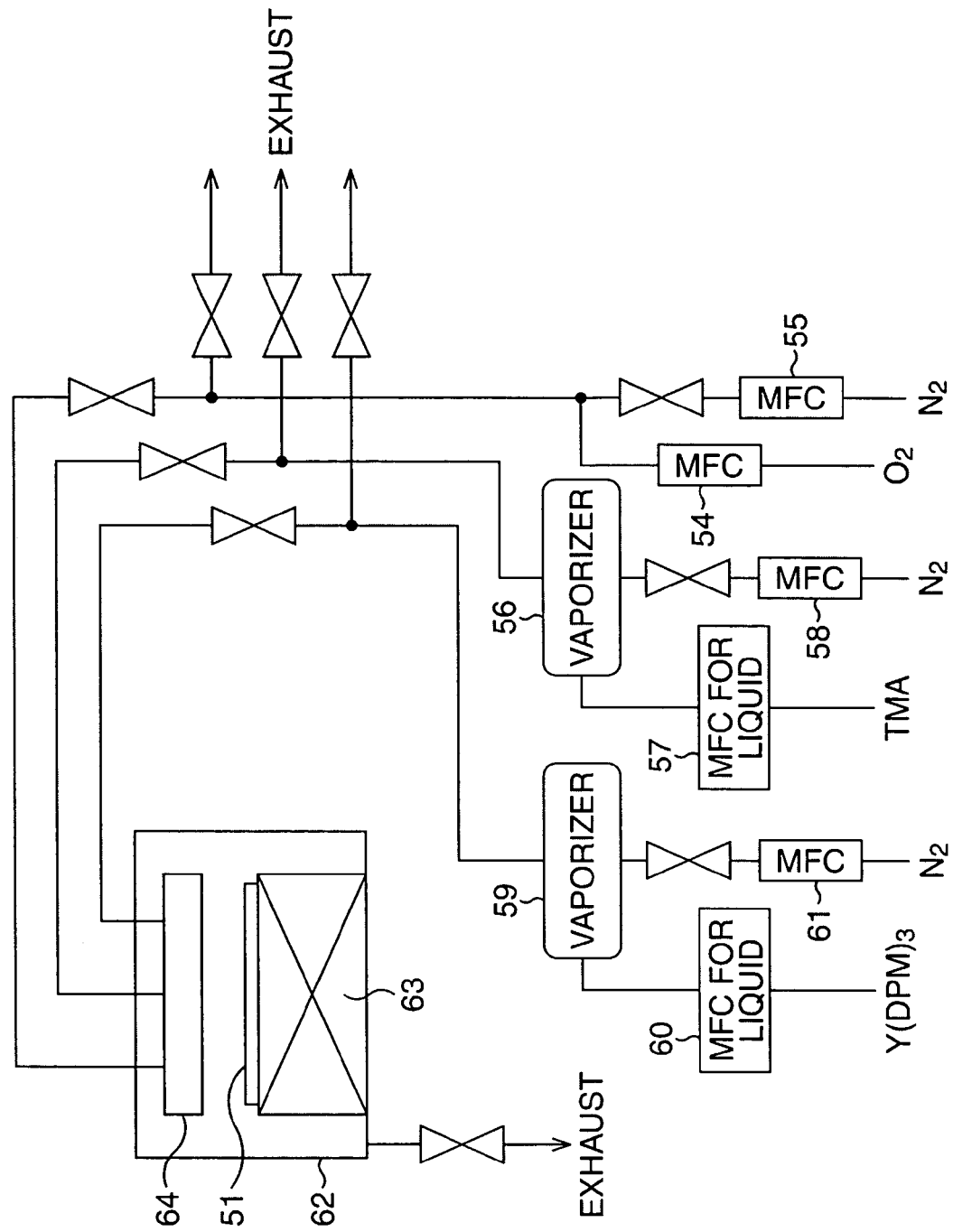
FIG. 14 is a schematic diagram showing a single-wafer system.

In the single-wafer system, as shown in FIG. 14, a film-forming chamber 62 in which a single Si wafer 51 is to be housed, and a heater 63 heating the Si wafer 51 and a showerhead 64 are provided in the film-forming chamber 62. Three pipes similar to the batch-mode system are connected to the showerhead 64.

A concentration of $Y(DPM)_3$ used in these apparatuses is, for example, approximately 0.01 to 0.05 mol/liter, a temperature of the vaporizer 59 is, for example, approximately 200° C. to 250° C., and a flow rate of $Y(DPM)_3$ is, for example, 1 mm$^3$/minute. In the case of supplying TMA, a supply in a liquid state without using any solvent is performed, and the flow rate thereof is 1 mm$^3$/minute and the temperature of the vaporizer 56 is, for example, 80° C. And further, the flow rate of $O_2$ is, for example, 100 to 1000 sccm. And the film-forming is performed in a condition that the pressure in the film-forming chamber 52 or the film-forming chamber 62 is 66.7 Pa to 667 Pa (0.5 Torr to 5.0 Torr) and that the film-forming temperature is 400° C. to 650° C.

In the case of forming $La_xAl_yO_x$ as the silicon oxide film containing a rare earth metal and Al, $La(DPM)_3$ (lanthanum dipivaloylmethanato) can be used instead of $Y(DPM)_3$.

Note that the insulating film containing Si, a rare earth metal, Al and O is not formed by the reaction of two films as described above, but can be formed, for example, by a chemical vapor deposition (CVD) or the like.

INDUSTRIAL APPLICABILITY

As described above, according to the present invention, the silicate film containing a rare earth metal is allowed to further contain Al so that the composition can be controlled relatively easily, resultingly, a dielectric film having high-temperature tolerance property and a high dielectric constant can be formed easily. Therefore, in the case of manufacturing a semiconductor device in which polysilicon is used, the heat treatment with high temperature can be performed in a conventional way, as a result, a high performance-semiconductor device can be obtained.

What is claimed is:

1. A method of manufacturing a semiconductor device comprising the steps of:
   forming a first insulating film containing silicon (Si) on a first conductive layer;
   forming a second insulating film containing an aluminate of a rare earth metal on the first insulating film; and
   forming a dielectric film containing Si and the rare earth metal by allowing the first insulating film to react with the second insulating film by a heat treatment,
   wherein the number of Al atoms in the second insulating film is allowed to be less than the number of rare earth metal atoms.

2. The method of manufacturing a semiconductor device according to claim 1, further comprising the step of forming a second conductive layer on the dielectric film.

3. The method of manufacturing a semiconductor device according to claim 1, further comprising the step of forming a second conductive layer on the second insulating film before said step of forming the dielectric film.

4. The method of manufacturing a semiconductor device according to claim 1, wherein the first insulating film is one kind selected from a group consisting of an Si oxide film, an Si nitride film and an Si oxynitride film.

5. The method of manufacturing a semiconductor device according to claim 1, further comprising the step of forming a third insulating film containing silicon (Si) and nitrogen (N) on the second insulating film before said step of forming the dielectric film,
   wherein the first insulating film, the second insulating film, and the third insulating film are allowed to react with one another in said step of forming the dielectric film.

6. The method of manufacturing a semiconductor device according to claim 1, wherein an amorphous film is formed as the dielectric film.

7. A method of forming a dielectric film comprising the steps of:
   forming a first insulating film containing silicon (Si),
   forming a second insulating film containing an aluminate of a rare earth metal on the first insulating film; and
   allowing the first insulating film and the second insulating film to be a single film with the first insulating film and the second insulating film reacting with each other by a heat treatment, wherein the number of Al atoms in the second insulating film is allowed to be less than the number of rare earth metal atoms.

8. The method of forming a dielectric film according to claim 7, wherein the first insulating film is one kind selected from a group consisting of an Si oxide film, an Si nitride film and an Si oxynitride film.

9. The method of forming a dielectric film according to claim 7, further comprising the step of forming a third insulating film containing silicon (Si) and nitrogen (N) on the second insulating film before said step of allowing the first insulating film and the second insulating film to be the single film,
   wherein the first insulating film, the second insulating film and the third insulating film are allowed to react with one another in said step of allowing the films to be the single film.

* * * * *